(12) United States Patent
Park et al.

(10) Patent No.: US 11,090,773 B2
(45) Date of Patent: Aug. 17, 2021

(54) METHOD FOR MANUFACTURING SERVER ROOM COOLING APPARATUS AND AIR CONDITIONING SYSTEM FOR DATA CENTER PROVIDED WITH SAME

(71) Applicant: NAVER CLOUD CORPORATION, Seongnam-si (KR)

(72) Inventors: Weon Gi Park, Seongnam-si (KR); Ji Hyun Koo, Seongnam-si (KR); Keun Ho Ryu, Seongnam-si (KR); Dong Ju Lee, Seongnam-si (KR); Jeong Beom Ko, Seongnam-si (KR); Hun Nam Ji, Seongnam-si (KR)

(73) Assignee: NAVER CLOUD CORPORATION, Seongnam-si (KR)

( * ) Notice: Subject to any disclaimer, the term of this patent is extended or adjusted under 35 U.S.C. 154(b) by 423 days.

(21) Appl. No.: 15/306,042

(22) PCT Filed: Jan. 14, 2015

(86) PCT No.: PCT/KR2015/000406
§ 371 (c)(1),
(2) Date: Oct. 21, 2016

(87) PCT Pub. No.: WO2015/163561
PCT Pub. Date: Oct. 29, 2015

(65) Prior Publication Data
US 2017/0043438 A1 Feb. 16, 2017

(30) Foreign Application Priority Data
Apr. 23, 2014 (KR) .................. 10-2014-0048881

(51) Int. Cl.
*B23P 15/26* (2006.01)
*H05K 7/20* (2006.01)

(52) U.S. Cl.
CPC .......... *B23P 15/26* (2013.01); *H05K 7/20663* (2013.01); *H05K 7/20745* (2013.01)

(58) Field of Classification Search
CPC . H05K 7/20745; H05K 7/20663; B23P 15/26; E04B 1/34321
See application file for complete search history.

(56) References Cited

U.S. PATENT DOCUMENTS 5,425,902 A * 6/1995 Miller .................. B01J 19/32
261/128
5,620,503 A * 4/1997 Miller .................. B01J 19/32
95/211

(Continued)

FOREIGN PATENT DOCUMENTS

JP 55-56072 U 4/1980
JP 2009-110469 5/2009

(Continued)

OTHER PUBLICATIONS

Office Action for KR Application No. 10-2014-0048881 dated Aug. 13, 2015.

(Continued)

*Primary Examiner* — Kun Kai Ma
(74) *Attorney, Agent, or Firm* — Greer Burns & Crain Ltd.

(57) ABSTRACT

Provided is a method of manufacturing a server room cooling apparatus, the method including: providing a housing; providing at least one frame in the housing; providing, on the at least one frame, a barrier wall configured to divide a space inside the housing into at least two spaces; forming a mist ejection unit configured to eject mist to an outer air supplied from outside the server room cooling apparatus, at a side of a supply unit that is formed by the barrier wall and supplies outer air to a server room; forming a filter unit configured to filter outer air supplied from outside the server (Continued)

room cooling apparatus, at a side of the mist ejection unit; and forming an outer air inflow unit into which outer air flows, at one side of the filter unit.

19 Claims, 19 Drawing Sheets

(56) References Cited

U.S. PATENT DOCUMENTS

| | | | | |
|---|---|---|---|---|
| 9,247,659 B1* | 1/2016 | Phillips | | H05K 7/2079 |
| 9,313,929 B1* | 4/2016 | Malone | | H05K 7/20745 |
| 9,395,974 B1* | 7/2016 | Eichelberg | | G06F 1/20 |
| 10,028,416 B2* | 7/2018 | Mao | | H05K 7/20745 |
| 2009/0301123 A1* | 12/2009 | Monk | | F24F 11/0001 |
| | | | | 62/259.2 |
| 2010/0300650 A1* | 12/2010 | Bean, Jr. | | H05K 7/20345 |
| | | | | 165/67 |
| 2011/0083824 A1* | 4/2011 | Rogers | | H05K 7/20745 |
| | | | | 165/80.2 |
| 2011/0173925 A1* | 7/2011 | Brown | | E04B 1/14 |
| | | | | 52/794.1 |
| 2011/0175498 A1* | 7/2011 | Bash | | F24F 11/0001 |
| | | | | 312/107 |
| 2011/0256822 A1* | 10/2011 | Carlson | | H05K 7/20827 |
| | | | | 454/184 |
| 2011/0259573 A1* | 10/2011 | Ezawa | | F24F 12/002 |
| | | | | 165/253 |
| 2012/0083196 A1* | 4/2012 | Mockridge | | H05K 7/20745 |
| | | | | 454/184 |
| 2013/0098597 A1* | 4/2013 | Fujimoto | | H05K 7/20745 |
| | | | | 165/287 |
| 2013/0111937 A1* | 5/2013 | Hendrix | | G06F 1/20 |
| | | | | 62/127 |
| 2014/0170951 A1* | 6/2014 | Ryu | | H05K 7/20745 |
| | | | | 454/184 |
| 2016/0057892 A1* | 2/2016 | Tabe | | H05K 7/20745 |
| | | | | 361/679.46 |
| 2016/0106008 A1* | 4/2016 | Cotton | | F24F 5/0007 |
| | | | | 165/248 |
| 2016/0192542 A1* | 6/2016 | LeFebvre | | H05K 7/20836 |
| | | | | 361/679.47 |
| 2016/0288991 A1* | 10/2016 | Richardson | | H05K 7/20745 |

FOREIGN PATENT DOCUMENTS

| | | |
|---|---|---|
| JP | 2010-261696 | 11/2010 |
| JP | 2012-098799 A | 5/2012 |
| JP | 2012-145289 A | 8/2012 |
| JP | 2013-92298 A | 5/2013 |
| JP | 2013-213616 A | 10/2013 |
| JP | 2013-253753 A | 12/2013 |
| KR | 10-2010-0122444 | 11/2010 |
| KR | 10-2012-0150969 | 12/2012 |

OTHER PUBLICATIONS

International Search Report for PCT Application No. PCT/KR2015/000406 dated Apr. 6, 2015.

Office Action issued in corresponding Japanese Patent App. No. 2016-563842, dated Sep. 19, 2017.

* cited by examiner

[Fig. 1]
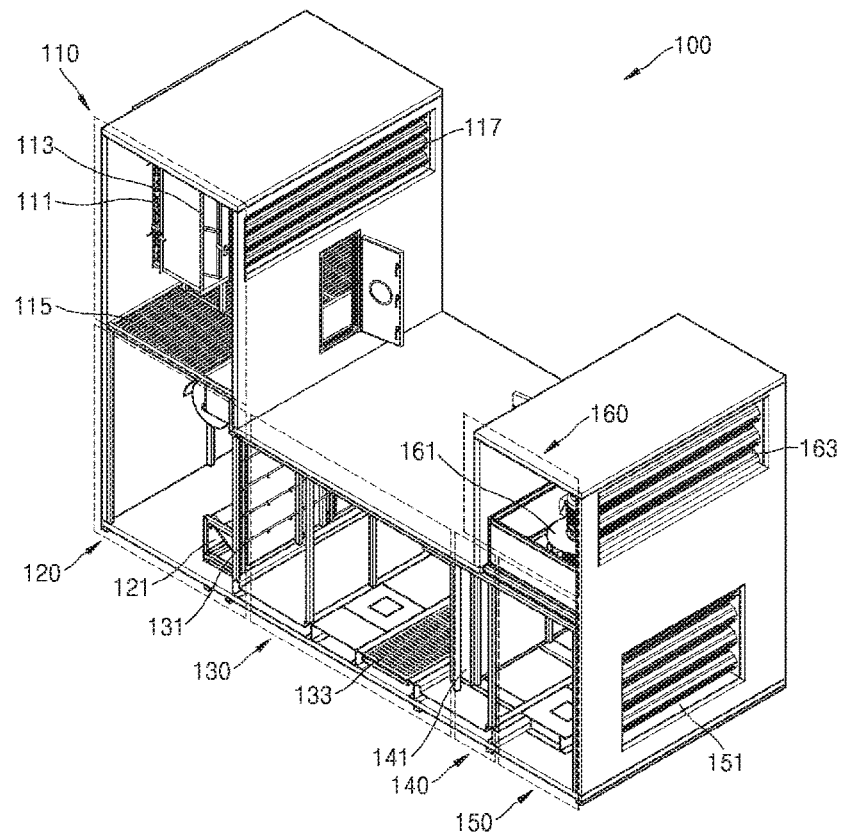
[Fig. 2]
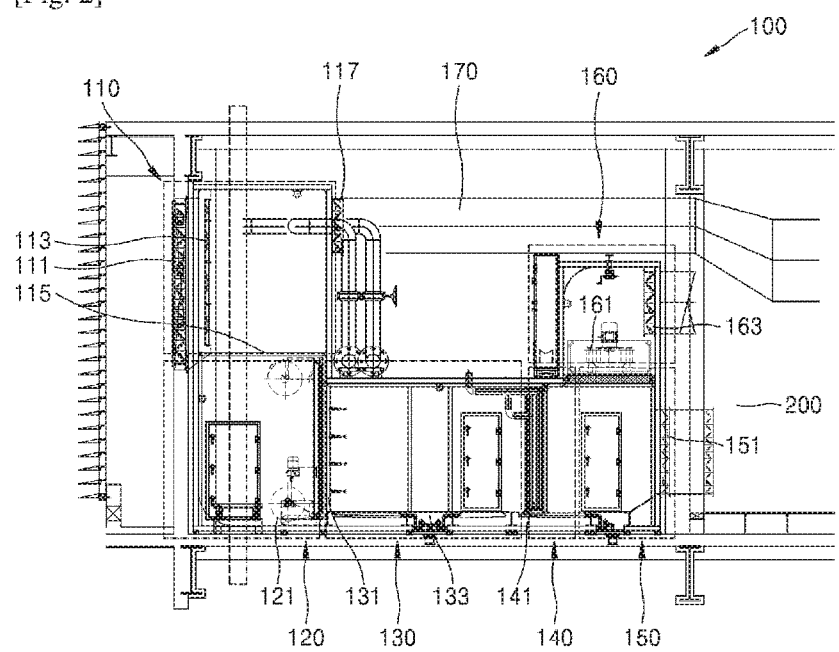

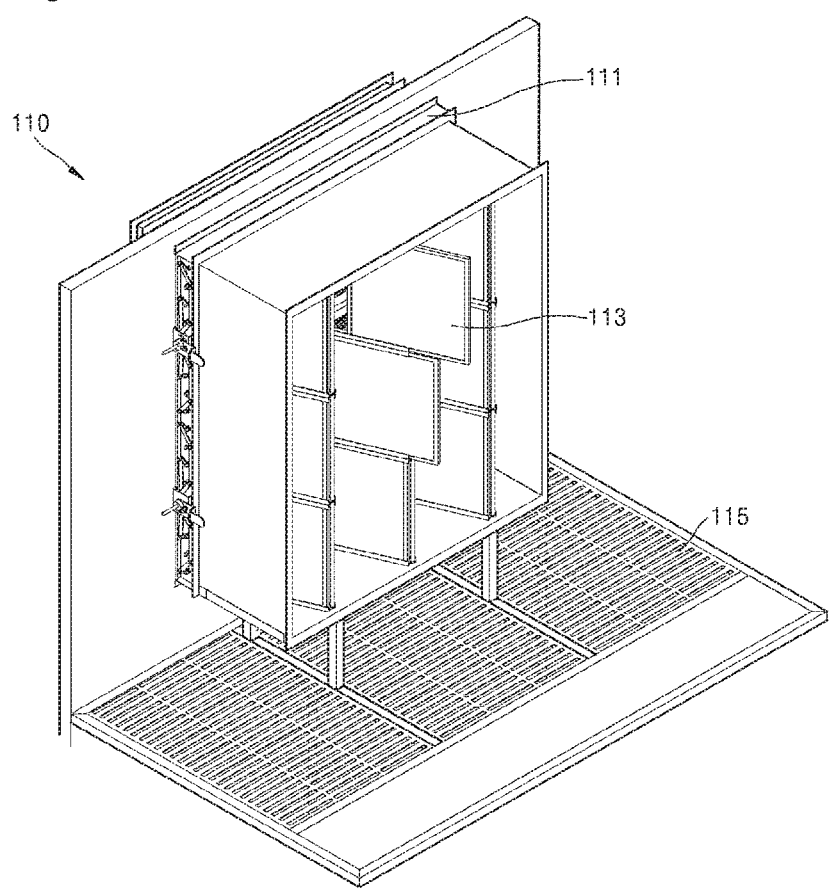
[Fig. 3]

[Fig. 4]
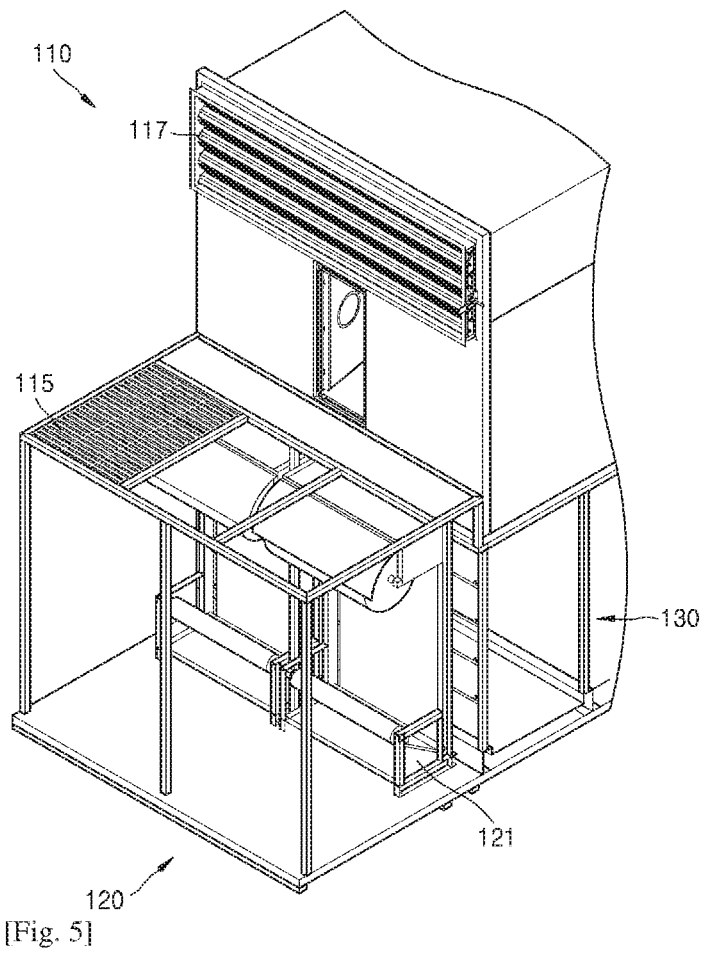
[Fig. 5]
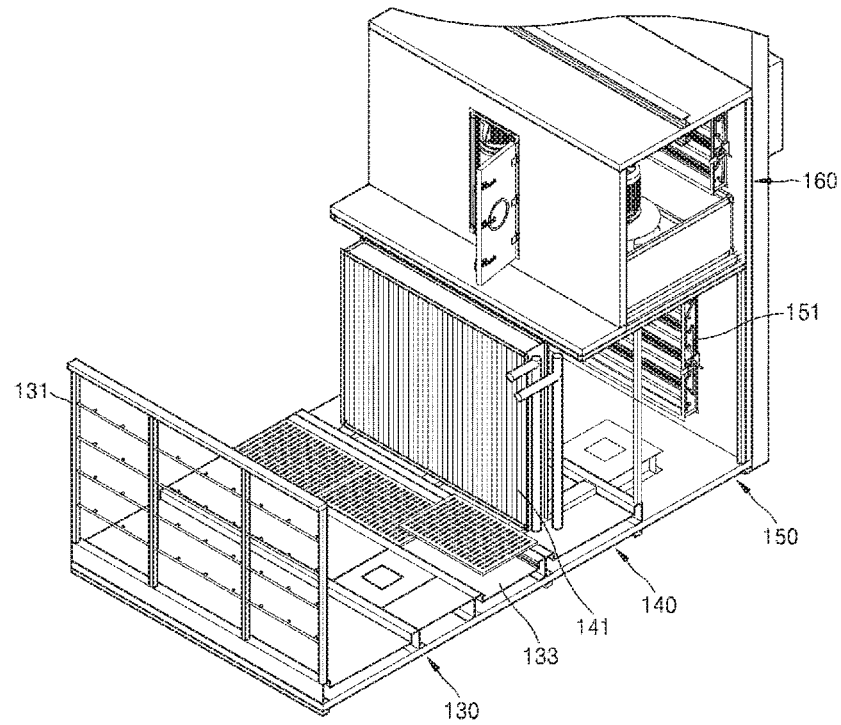

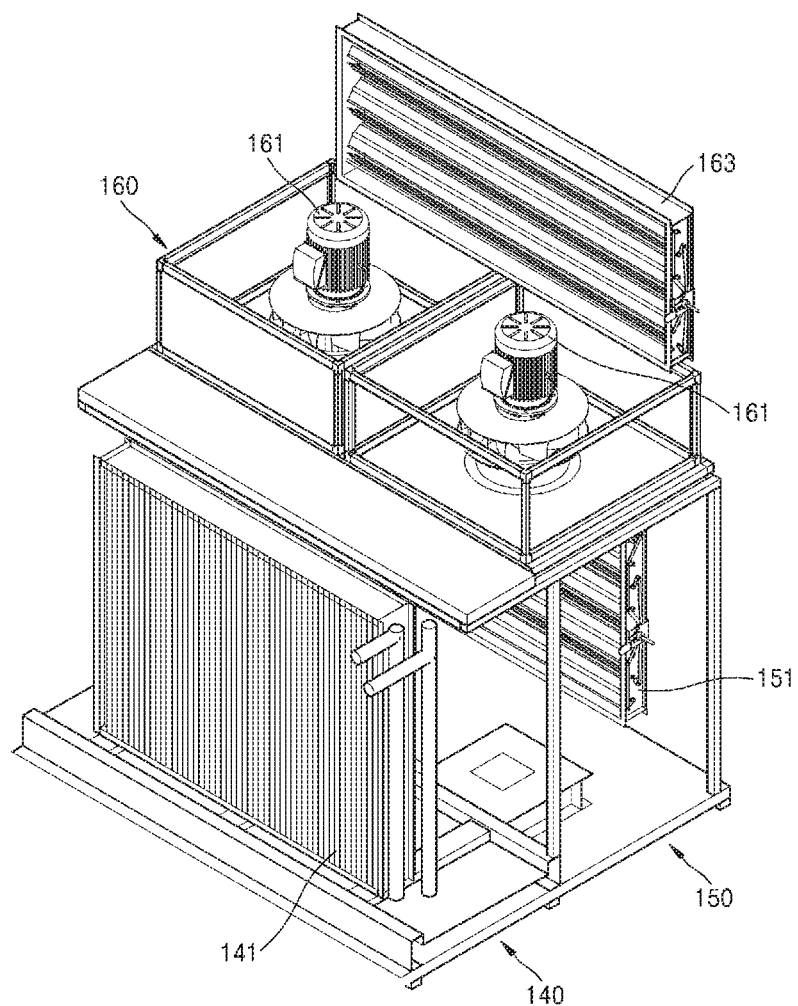
[Fig. 6]

[Fig. 7]
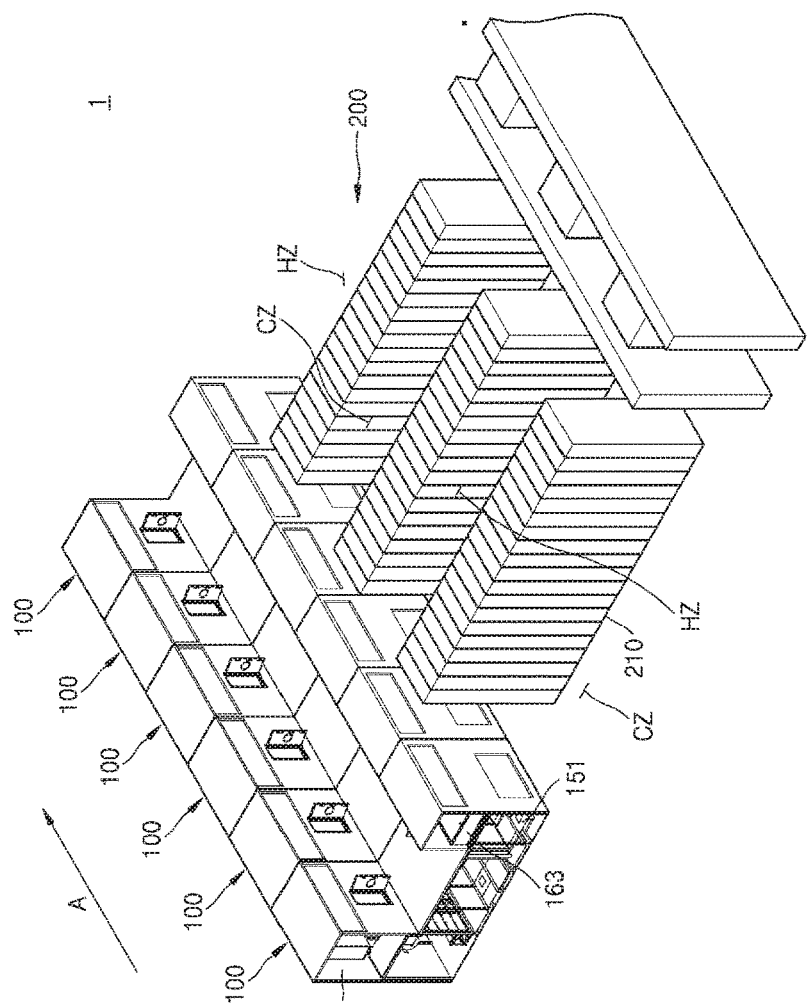
[Fig. 8]
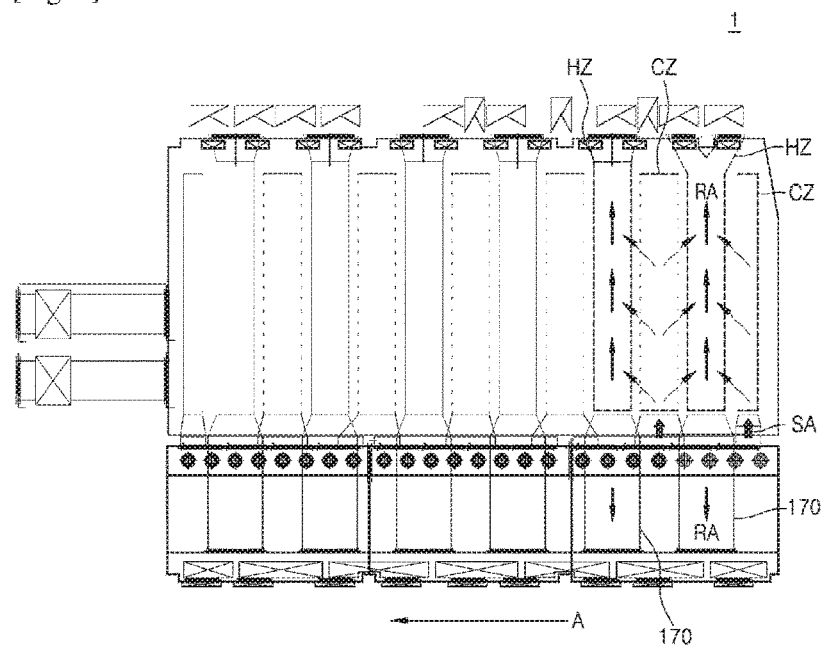

[Fig. 9]
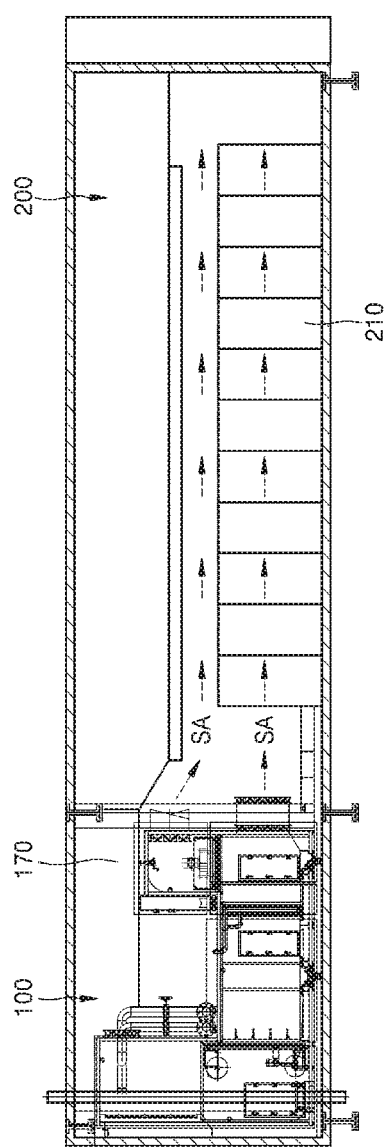

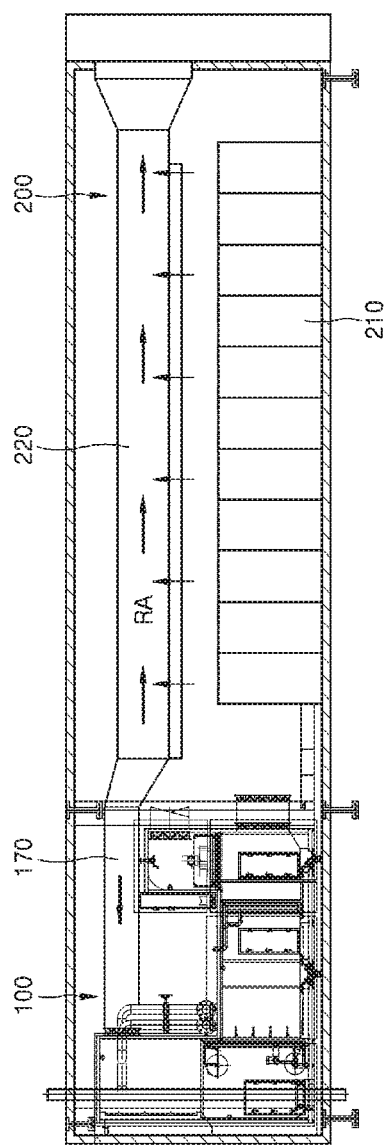
[Fig. 10]

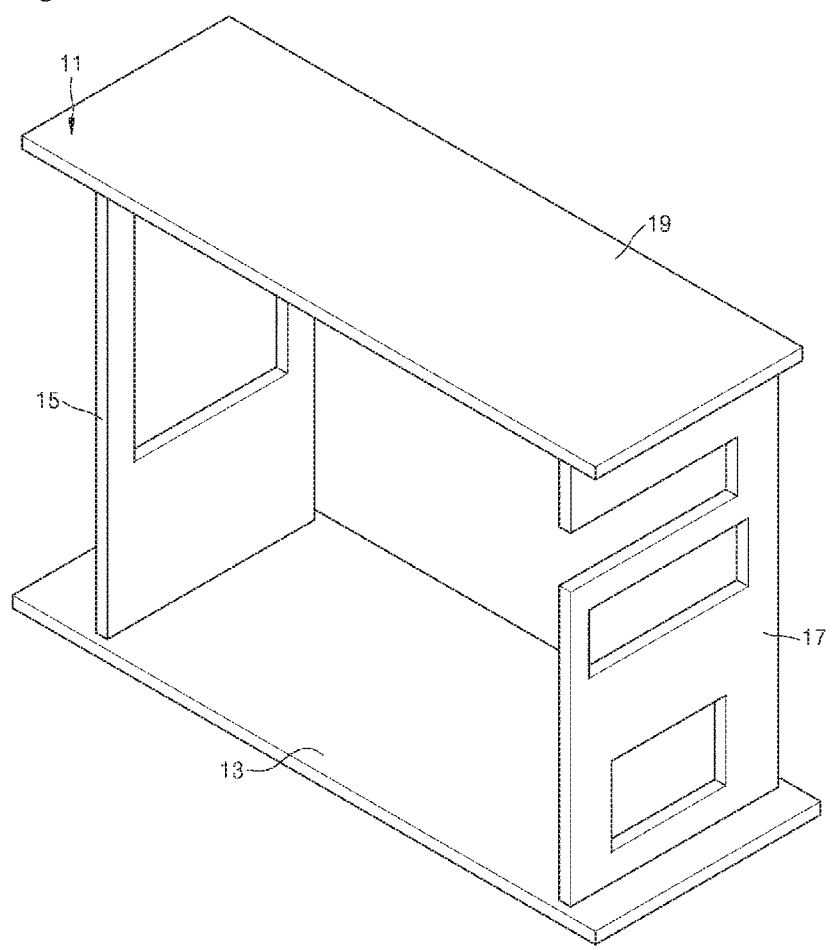
[Fig. 11]

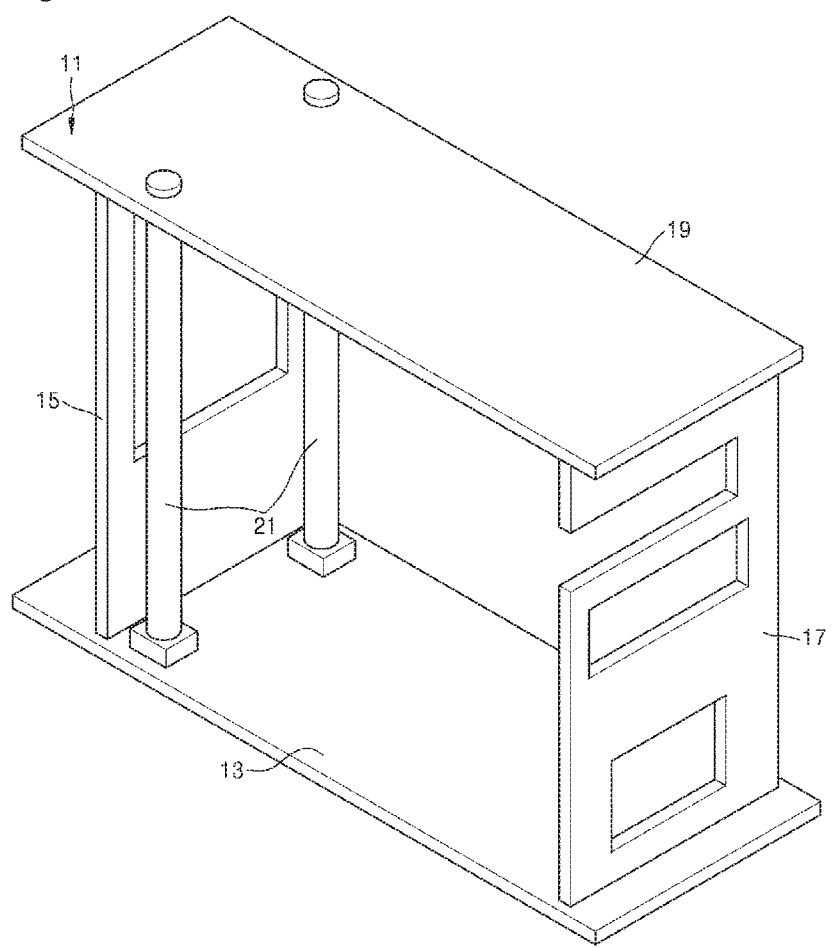
[Fig. 12]

[Fig. 13]
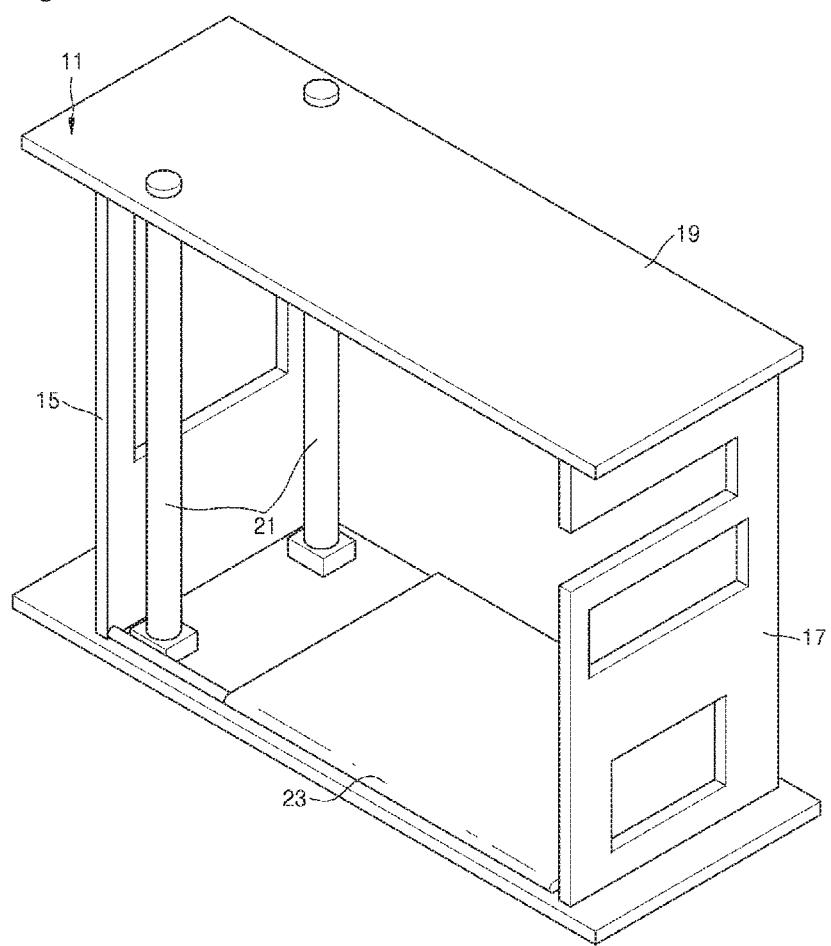

[Fig. 14]
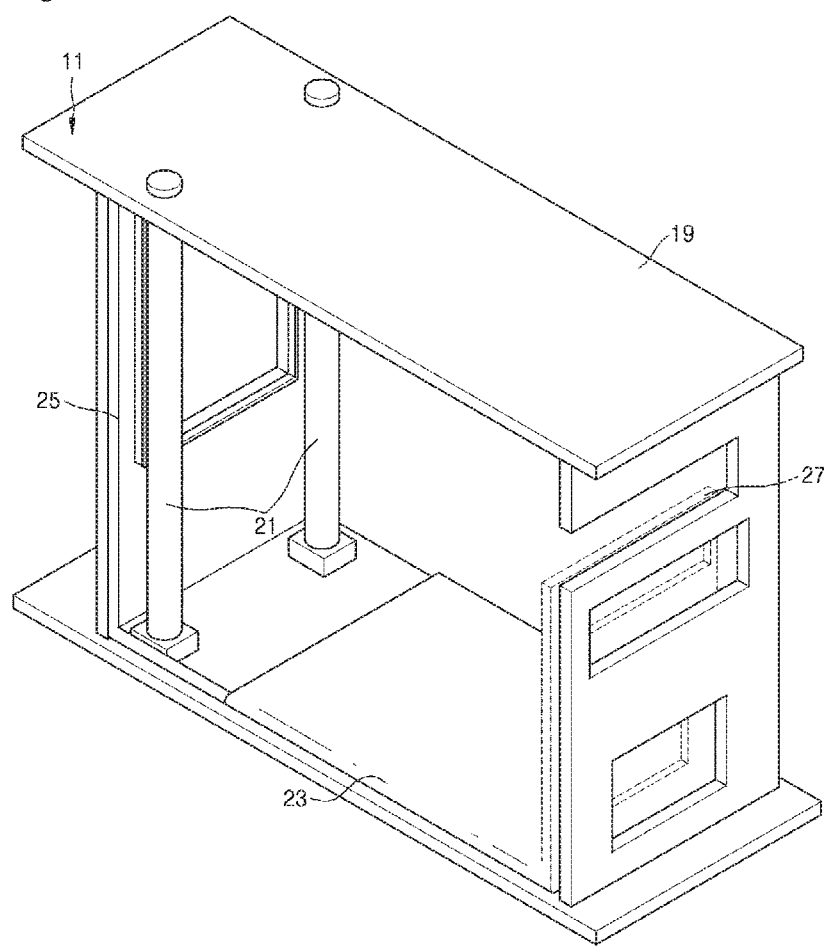

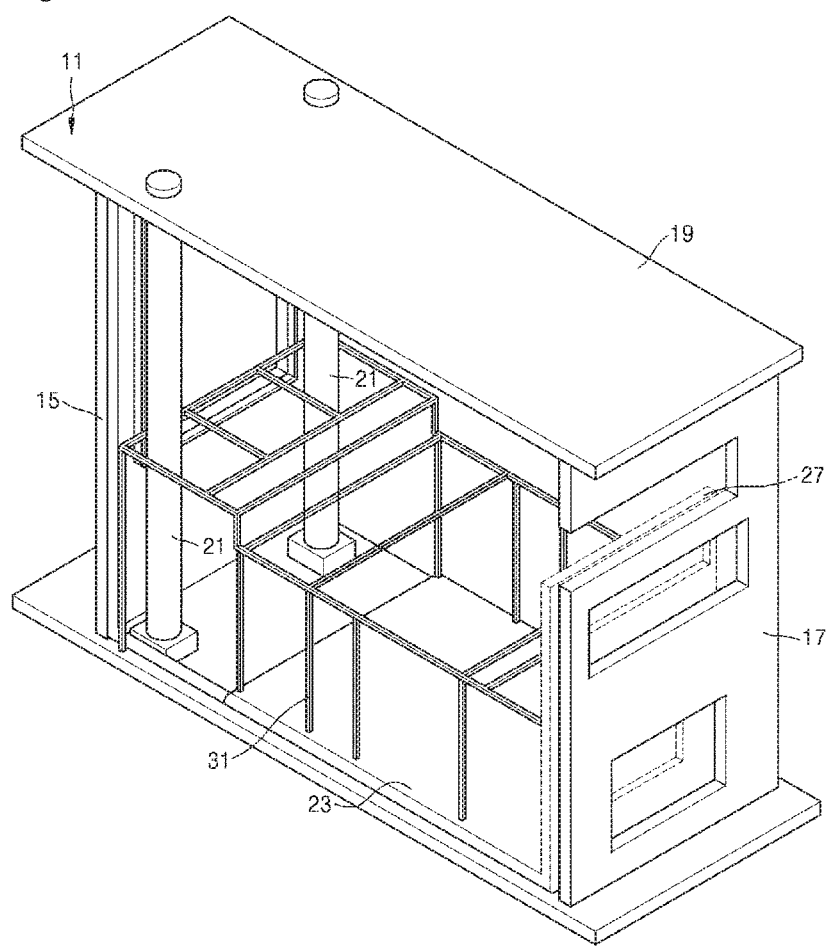
[Fig. 15]

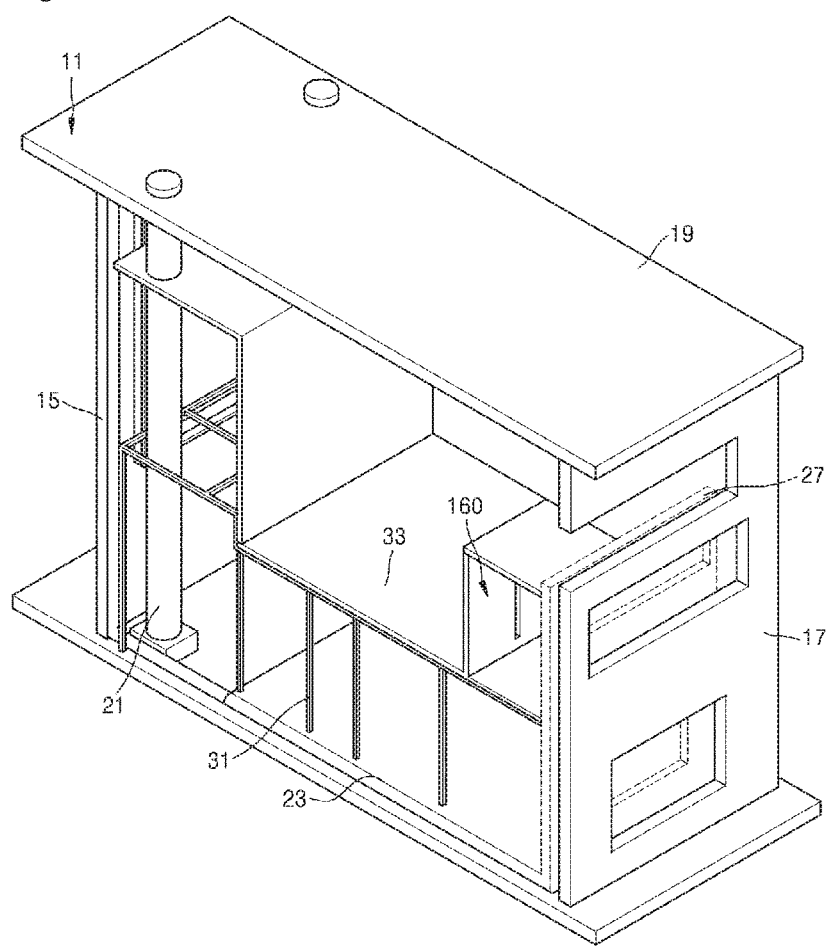
[Fig. 16]

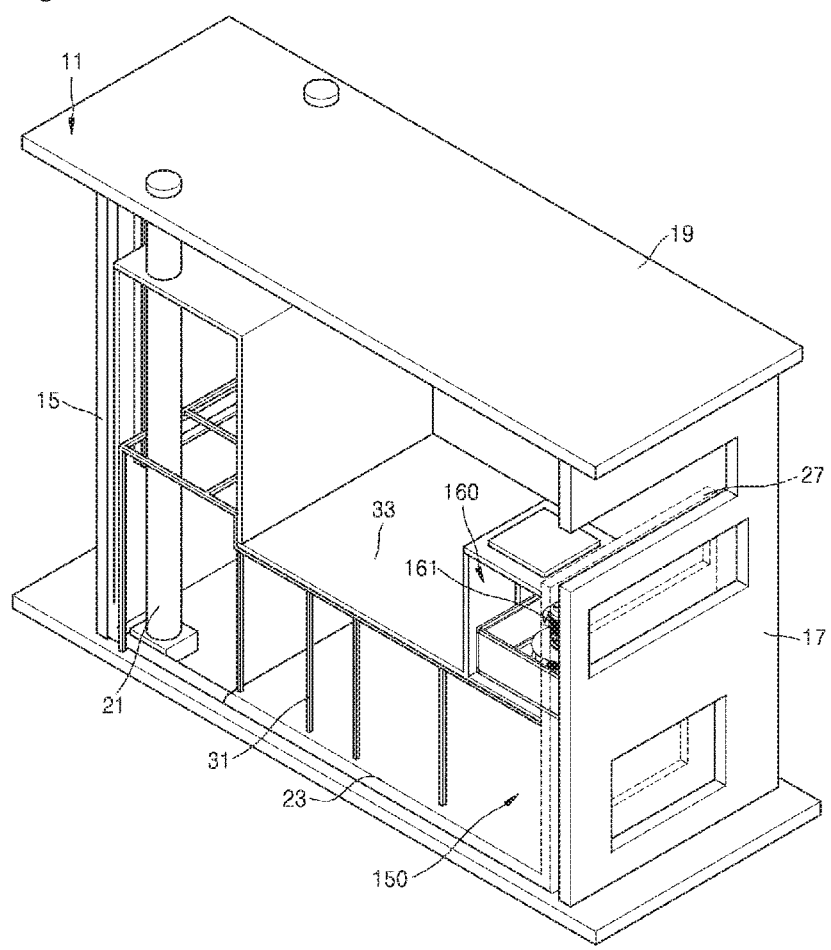
[Fig. 17]

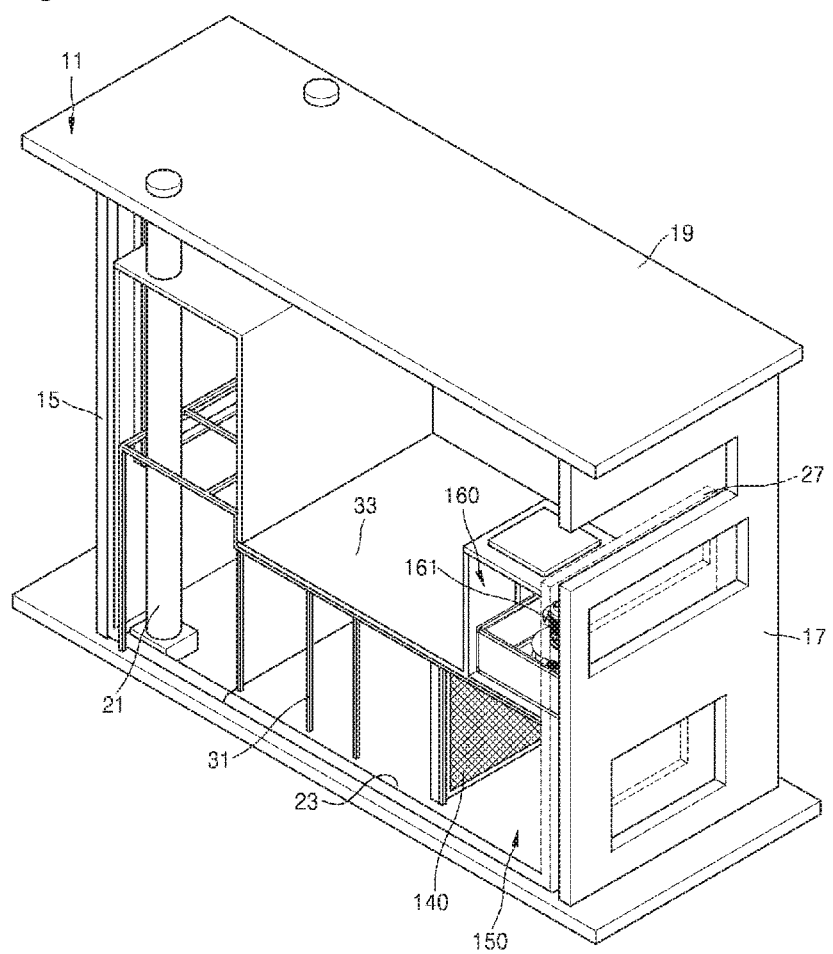
[Fig. 18]

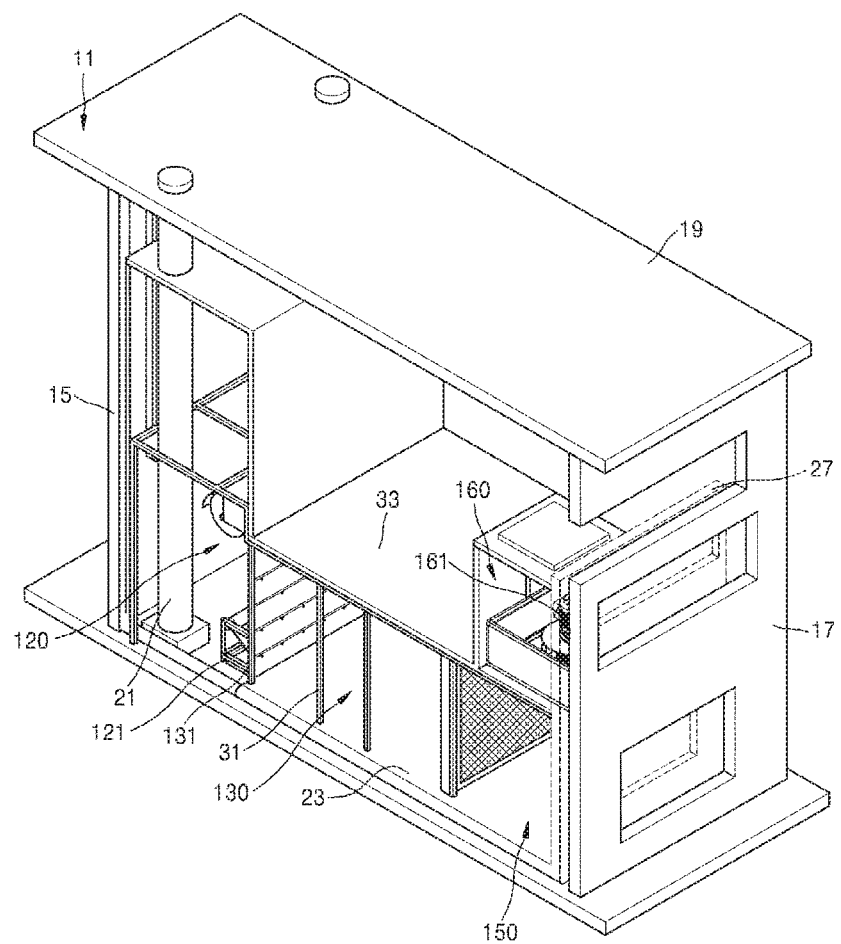
[Fig. 19]

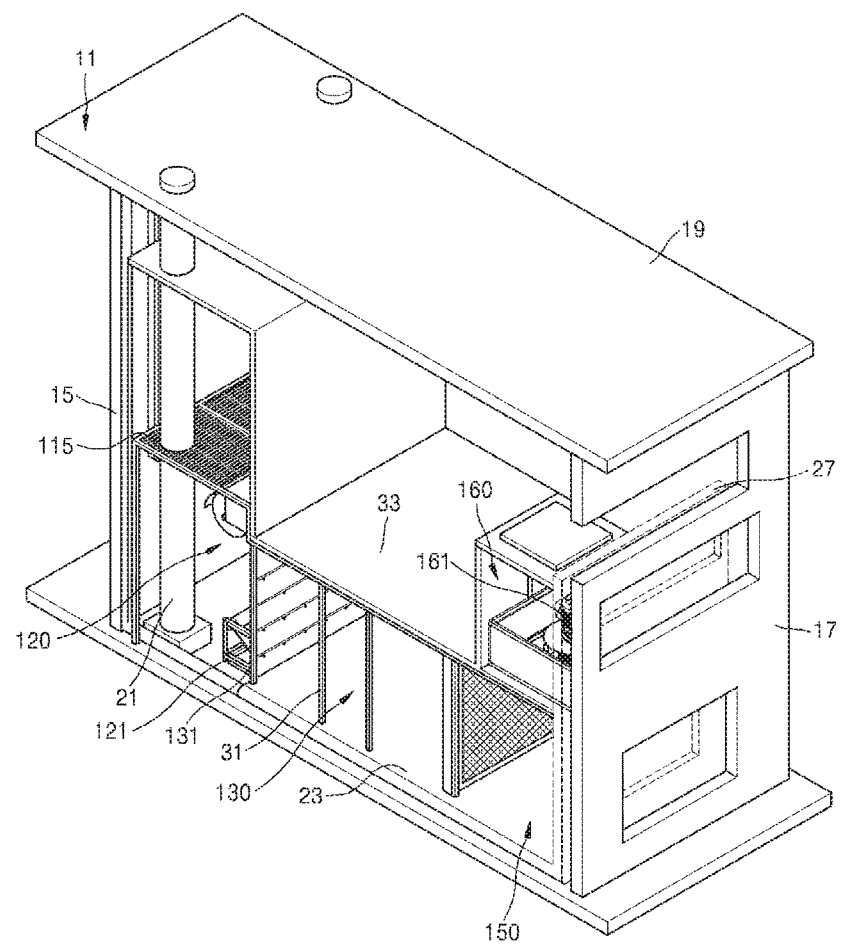
[Fig. 20]

[Fig. 21]
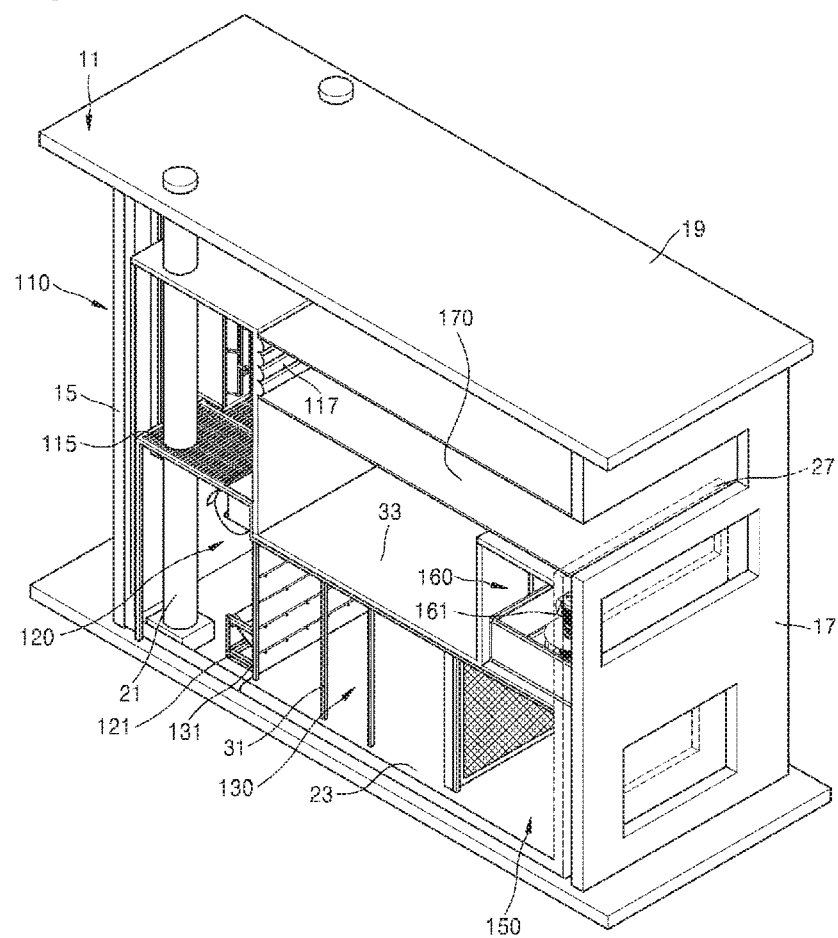
[Fig. 22]
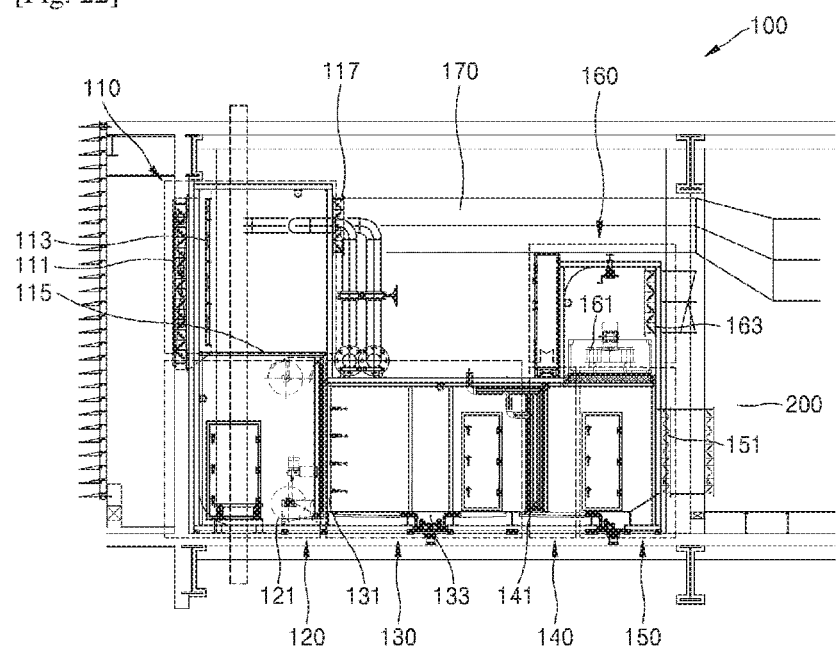

[Fig. 23]
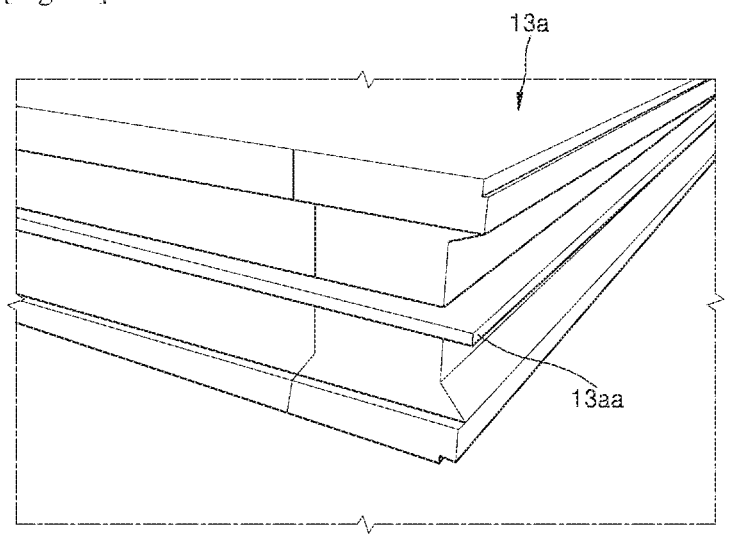
[Fig. 24]
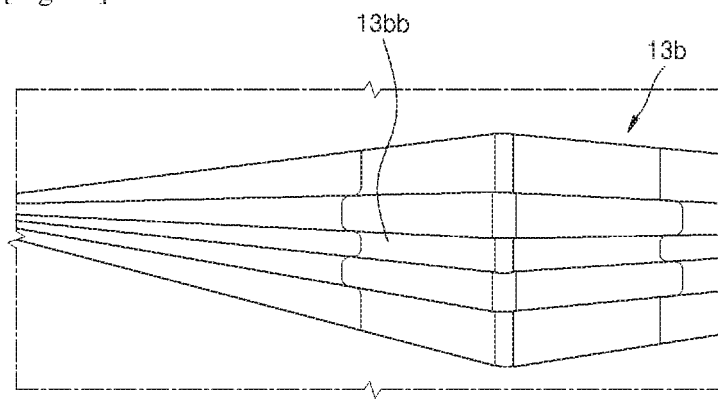

METHOD FOR MANUFACTURING SERVER ROOM COOLING APPARATUS AND AIR CONDITIONING SYSTEM FOR DATA CENTER PROVIDED WITH SAME

CROSS-REFERENCE TO RELATED APPLICATIONS

This application is a U.S. National Phase Application under 35 U.S.C. § 371 of International Application No. PCT/KR2015/000406 filed on Jan. 14, 2015, which claims the benefit of priority from Korean Patent Application No. 10-2014-0048881, filed on Apr. 23, 2014. The disclosure of International Application No. PCT/KR2015/000406 and Korean Patent Application No. 10-2014-0048881 are incorporated herein by reference.

TECHNICAL FIELD

One or more embodiments relate to a method of manufacturing a server room cooling apparatus that cools a server room by using external natural air, and a method of manufacturing an air conditioning system of a data center, the air conditioning system including the server room cooling apparatus.

BACKGROUND ART

A server, network equipment, enterprise equipment, etc. included in a data center generate heat. Accordingly, the data center operating such pieces of equipment also requires large scale facilities for reducing heat.

In order to cool the heat of the data center, cold air is supplied to each piece of equipment, and in this regard, a thermostat that is used to generate cold air is generally used.

However, energy consumed to activate the thermostat and facilities connected to the thermostat is about 50 to 60% of the total electricity used in the data center. Accordingly, in order to reduce the amount of energy used to cool the data center, a method of reducing the heat of the pieces of equipment by introducing cold air from outside a building into a server room has been recently introduced.

In this regard, KR 10-2011-0129514 (published on Dec. 2, 2011) "Air Conditioning System of Internet Data Center for Green Computing Environment" discloses technology in which outer air is controlled to be introduced to a data center, is cooled through a cooling unit, and is introduced into the data center.

Information disclosed in this Background section was already known to the inventors before achieving the inventive concept or is technical information acquired in the process of achieving the inventive concept. Therefore, it may contain information that does not form the prior art that is already known to the public in this country.

Technical Problem

One or more embodiments include a method of manufacturing a server room cooling apparatus capable of maintaining a suitable temperature and humidity of a data center by using outer air, and a method of manufacturing an air conditioning system of the data center, the air conditioning system including the server room cooling apparatus.

Also, one or more embodiments include a method of manufacturing a server room cooling apparatus capable of reducing the amount of energy consumed to cool a data center, and a method of manufacturing an air conditioning system of the data center, the air conditioning system including the server room cooling apparatus.

Also, one or more embodiments include a method of manufacturing a server room cooling apparatus capable of increasing a period of cooling a data center by using outer air, and a method of manufacturing an air conditioning system of the data center, the air conditioning system including the server room cooling apparatus.

Also, one or more embodiments include a method of manufacturing a server room cooling apparatus capable of effectively blocking foreign substances included in outer air and reducing maintenance expenses, and a method of manufacturing an air conditioning system of a data center, the air conditioning system including the server room cooling apparatus.

Also, one or more embodiments include a method of manufacturing a server room cooling apparatus suitable for environment conditions that change a lot according to temperature/humidity states of outer air, and a method of manufacturing an air conditioning system of a data center, the air conditioning system including the server room cooling apparatus.

Also, one or more embodiments include a method of manufacturing a server room cooling apparatus in which a first supply unit is configured to perform an operation of an emergency outer air introducing unit such that outer air is immediately supplied into a server room during an emergency, such as system malfunction, to prevent a temperature increase in the server room, and a method of manufacturing an air conditioning system of a data center, the air conditioning system including the server room cooling apparatus.

Also, one or more embodiments include a method of manufacturing a server room cooling apparatus capable of intactly using an existing structure of a data center while connecting a server room and the server room cooling apparatus, and a method of manufacturing an air conditioning system of the data center, the air conditioning system including the server room cooling apparatus.

Also, one or more embodiments include a method of manufacturing a server room cooling apparatus in which space use inside a data center is increased since a space for installing a thermostat and for supplying cool air is not required to be separately provided, and a method of manufacturing an air conditioning system of the data center, the air conditioning system including the server room cooling apparatus.

Technical Solution

According to one or more embodiments, a method of manufacturing a server room cooling apparatus includes: providing a housing; providing at least one frame in the housing; providing, on the at least one frame, a barrier wall configured to divide a space inside the housing into at least two spaces; forming a mist ejection unit configured to eject mist to an outer air supplied from outside the server room cooling apparatus, at a side of a supply unit that is formed by the barrier wall and supplies outer air to a server room; forming a filter unit configured to filter outer air supplied from outside the server room cooling apparatus, at a side of the mist ejection unit; and forming an outer air inflow unit into which outer air flows, at one side of the filter unit.

According to one or more embodiments, a method of manufacturing an air conditioning system of a data center includes: manufacturing a server room cooling apparatus according to the method described above; and forming a server room comprising a plurality of server racks provided along a first direction, at one side of the server room cooling apparatus.

These and/or other aspects will become apparent and more readily appreciated from the following description of the embodiments, taken in conjunction with the accompanying drawings.

Advantageous Effects

According to methods of manufacturing a server room cooling apparatus and an air conditioning system of a data center, the air conditioning system including the server room cooling apparatus, according to embodiments, the server room cooling apparatus and the air conditioning system may be operated year-round, without stopping even under environment conditions in which temperature/humidity states change a lot, by spraying mist into outer air fed in from outside a building to supply cold air into a server room, thereby remarkably reducing the amount of energy consumed to cool the data center.

Also, according to methods of manufacturing a server room cooling apparatus and an air conditioning system of a data center, the air conditioning system including the server room cooling apparatus, according to embodiments, the server room cooling apparatus and the air conditioning system may block foreign substances included in outer air by using a double filter automatically replaced based on a contamination level, thereby effectively blocking the foreign substances and reducing maintenance expenses.

Also, according to methods of manufacturing a server room cooling apparatus and an air conditioning system of a data center, the air conditioning system including the server room cooling apparatus, according to embodiments, the server room cooling apparatus and the air conditioning system may measure the temperature and humidity of outer air fed in from outside a building and adjust a spray amount of mist based on the temperature and the humidity, and thus may be optimally operated even under environment conditions in which temperature/humidity states of outer air change a lot.

Also, according to methods of manufacturing a server room cooling apparatus and an air conditioning system of a data center, the air conditioning system including the server room cooling apparatus, according to embodiments, the server room cooling apparatus and the air conditioning system may prevent a temperature increase inside a server room by immediately supplying outer air into the server room during an emergency, such as system malfunction.

Also, according to methods of manufacturing a server room cooling apparatus and an air conditioning system of a data center, the air conditioning system including the server room cooling apparatus, according to embodiments, space use inside the data center may be increased.

Also, according to methods of manufacturing a server room cooling apparatus and an air conditioning system of a data center, the air conditioning system including the server room cooling apparatus, according to embodiments, an existing structure of the data center may not be changed and intactly used while connecting a server room and the server room cooling apparatus.

DESCRIPTION OF THE DRAWINGS

FIG. 1 is a perspective view of a server room cooling apparatus according to an embodiment.

FIG. 2 is a lateral view of the server room cooling apparatus of FIG. 1.

FIG. 3 is a perspective view illustrating in detail an outer air inflow unit of the server room cooling apparatus of FIG. 1.

FIG. 4 is a perspective view illustrating in detail a filter unit of the server room cooling apparatus of FIG. 1.

FIG. 5 is a perspective view illustrating in detail a mist ejection unit and a cooling unit of the server room cooling apparatus of FIG. 1.

FIG. 6 is a perspective view illustrating in detail a first supply unit and a second supply unit of the server room cooling apparatus of FIG. 1.

FIG. 7 is a perspective view of an air conditioning system of a data center, according to an embodiment.

FIG. 8 is a plan view of the air conditioning system of the data center of FIG. 7.

FIG. 9 is a lateral view of a cool zone of the air conditioning system of the data center of FIG. 7.

FIG. 10 is a lateral view of a hot zone of the air conditioning system of the data center of FIG. 7.

FIGS. 11 through 22 are views for describing a method of manufacturing a server room cooling apparatus 100, according to an embodiment of the present disclosure.

FIG. 23 is a perspective view of any one side surface of a housing, and FIG. 24 is a perspective view of another side surface of the housing, which is formed to engage with the one side surface.

DETAILED DESCRIPTION OF THE INVENTION

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description. While such terms as "first", "second", etc., may be used to describe various components, such components must not be limited to the above terms. The above terms are used only to distinguish one component from another. An expression used in the singular encompasses the expression of the plural, unless it has a clearly different meaning in the context. In the present specification, it is to be understood that the terms such as "including" or "having," etc., are intended to indicate the existence of the features or components, and are not intended to preclude the possibility that one or more other features or components may exist or may be added. In drawings, for convenience of description, sizes of components may be exaggerated for clarity. For example, since sizes and thicknesses of components in drawings are arbitrarily shown for convenience of description, the sizes and thicknesses are not limited thereto.

Hereinafter, one or more embodiments will be described in detail with reference to accompanying drawings. In drawings, like reference numerals refer to like elements throughout and overlapping descriptions shall not be repeated.

FIG. 1 is a perspective view of a server room cooling apparatus according to an embodiment, FIG. 2 is a lateral view of the server room cooling apparatus of FIG. 1. Meanwhile, FIG. 3 is a perspective view illustrating in detail an outer air inflow unit of the server room cooling apparatus of FIG. 1, FIG. 4 is a perspective view illustrating in detail a filter unit of the server room cooling apparatus of FIG. 1, FIG. 5 is a perspective view illustrating in detail a mist ejection unit and a cooling unit of the server room cooling apparatus of FIG. 1, and FIG. 6 is a perspective view illustrating in detail a first supply unit and a second supply unit of the server room cooling apparatus of FIG. 1.

First, referring to FIGS. 1 and 2, a server room cooling apparatus 100 according to an embodiment includes an outer air inflow unit 110, a filter unit 120, a mist ejection unit 130, a cooling unit 140, a first supply unit 150, and a second supply unit 160.

The server room cooling apparatus 100 using outer air according to an embodiment supplies cold outer air to a place where heat needs to be reduced, such as a data center, and cools the inside of a server room at a low cost by using outer air (for example, air outside a building) year-round without stopping even under environment conditions that change a lot according to temperature/humidity states. The server room cooling apparatus 100 will now be described in detail.

Referring to FIGS. 1 through 3, the outer air inflow unit 110 introduces air outside the server room cooling apparatus 100 into the server room cooling apparatus 100. Such an outer air inflow unit 110 includes an outside air (OA) damper 111, a demister filter 113, a grating unit 115, and a return air (RA) damper 117. Also, although not shown in the drawings, the outer air inflow unit 110 may further include a certain mesh (not shown) between the OA damper 111 and the demister filter 113.

The OA damper 111 controls opening and closing of the outer air inflow unit 110 to control the amount of outer air flowing in through the outer air inflow unit 110. An example of the OA damper 111 includes a motor damper (MD) that is automatically opened or closed by an electric motor or air pressure.

The demister filter 113 is an apparatus that removes moisture or foreign substances in vapor, and is manufactured by stacking a plurality of meshes or by charging an object in a fiber state. Such a demister filter 113 is formed to have low resistance, high particle collection efficiency, and high corrosion resistance, is simply cleaned, and is conveniently handled as it is light in weight.

Here, the outer air inflow unit 110 of the server room cooling apparatus 100 according to an embodiment includes the mesh (not shown) and the demister filter 113 immediately adjacent to the OA damper 111 into which outer air flows, such that foreign substances included in the outer air do not enter into the server room cooling apparatus 100. In other words, the outer air inflow unit 110 includes the mesh (not shown) immediately adjacent to the OA damper 111 to prevent a bird or a large insect from entering, and includes the demister filter 113 therein to remove the foreign substances entering the server room cooling apparatus 100. Here, a plurality of the demister filters 113 may be included, and as shown in FIG. 3, the plurality of demister filters 113 may be arranged in a zigzag to process large air volume, thereby increasing an installation area.

The grating unit 115 including a plurality of openings may be provided on a lower bottom surface of the outer air inflow unit 110, i.e., on a surface of the outer air inflow unit 110 connected to the filter unit 120, to transmit outer air flowed in to the outer air inflow unit 110 to the filter unit 120.

Meanwhile, a return duct unit 170 to which return air that has passed through the server room is supplied may be connected to one side of the outer air inflow unit 110, and the RA damper 117 for controlling air flow between the outer air inflow unit 110 and the return duct unit 170 may be further provided between the outer air inflow unit 110 and the return duct unit 170. The RA damper 117 adjusts a mixing ratio of outer air and return air to control the temperature of air supplied into the server room cooling apparatus 100 to be maintained at a suitable level.

Meanwhile, a case forming an external shape of the outer air inflow unit 110 may be formed of, for example, urethane, and an overall internal and external sealing operation may be performed on the case so that air does not leak. Also, although not shown in drawings, a demister filter differential pressure gauge (not shown) may be additionally provided in the outer air inflow unit 110 to check differential pressure of a filter.

The demister filter 113 of the outer air inflow unit 110 and a roll filter 121 of the filter unit 120 blocks foreign substances, such as dust, included in outer air, thereby preventing malfunction of a server, network equipment, or enterprise equipment in the server room.

Then, referring to FIGS. 1, 2, and 4, the filter unit 120 is provided at one side of the outer air inflow unit 110, and filters outer air supplied through the outer air inflow unit 110. Such a filter unit 120 is provided below the outer air inflow unit 110, and thus may be provided in a direction substantially perpendicular to an outer air inflow direction of the outer air inflow unit 110.

The filter unit 120 may include the roll filter 121. The roll filter 121 may re-filter foreign substances included in outer air. Here, the roll filter 121 may have a rolled shape and be automatically replaced according to a contamination level of the roll filter 121. Thus, the roll filter 121 may be used for a long period of time after being installed once, and since replacement of a filtering member is simple, a replacement time of the roll filter 121 may be reduced. Such a roll filter 121 may be configured to be driven according to a difference in pressure between a front and rear of a filter by providing a separate controller (not shown), and for example, may be set to be automatically driven by a differential pressure sensor within a pressure loss range of 7 mmAq to 20 mmAq. Also, at this time, a differential pressure range may be set by a user. Such a roll filter 121 may be formed of a material, such as stainless steel having excellent durability and anodized aluminum, and may be reusable after being washed several times based on a type of the filtering member.

Then, referring to FIGS. 1, 2, and 5, the mist ejection unit 130 may be provided at one side of the filter unit 120 and eject mist into outer air that has passed through the filter unit 120. In detail, the mist ejection unit 130 includes an ejection nozzle 131, and ejects minute water particles, i.e., mist, into outer air that is fed in through the outer air inflow unit 110 such that the temperature and humidity inside the server room are maintained at a suitable level. In other words, by ejecting mist into the outer air, the mist ejection unit 130 increases low humidity that is a characteristic of outer air, and decreases the temperature of the outer air, thereby supplying air suitable for operating equipment into the server room. Such a mist ejection unit 130 may eject mist by increasing pressure of water by using a pump and directly ejecting the mist into outer air passing through the mist ejection unit 130 through the ejection nozzle 131. Here, in order to increase the mist ejection effect, a distance between the ejection nozzle 131 and a cooling member 141 of the cooling unit 140 may be optimized. As such, by directly ejecting mist into outer air, the temperature of the outer air may be reduced by about 2 to 4° C., and thus an operating time of the cooling unit 140 may be reduced, thereby reducing energy consumption.

Meanwhile, the mist ejection unit 130 may further include a drain unit 133 for collecting condensed water. Such a drain unit 133 may be provided below the mist ejection unit 130 to smoothly externally discharge water that is condensed and collected at the bottom of the drain unit 133.

Meanwhile, the cooling unit 140 may be provided between the mist ejection unit 130 and the first supply unit 150 to cool the outer air that has passed through the mist ejection unit 130 once more. The cooling unit 140 may include the cooling member 141 that has a cooling coil shape, and at this time, the cooling member 141 may be an oval coil. In other words, the cooling member 141 may be a copper pipe having an oval shape and may be formed to reduce air resistance and at the same time, increase cooling performance at the back of the coil. Such an oval coil is suitable for energy reduction since a low static pressure is maintained even at a high wind speed.

In a conventional air conditioning system of a data center, a thermostat used to generate cold air is generally provided at one side of a server room separately from a server room cooling apparatus. In this case, since the thermostat is provided at one side of the server room, a separate space for disposing the thermostat in the data center is required, and in addition, a structure of the server room needs to be changed in order to connect the thermostat and the server room.

In contrast, in the server room cooling apparatus according to an embodiment and the air conditioning system of the data center of the present invention, the air conditioning system including the server room cooling apparatus, the cooling unit 140 performing a function of a thermostat is provided inside the server room cooling apparatus 100, and thus a separate space for disposing a thermostat is not required and space use inside the data center is increased. In addition, since a structure of a server room is not required to be changed in order to connect the server room and a thermostat, an existing structure of the data center is not changed and may be intactly used.

Then, referring to FIGS. 1, 2, and 6, the first supply unit 150 is provided at one side of the mist ejection unit 130 or the cooling unit 140 to supply outer air that has passed through the mist ejection unit 130 or the cooling unit 140 to the server room, particularly, to the bottom of the server room. The first supply unit 150 includes a first supply damper 151, and the first supply damper 151 controls opening and closing of the first supply unit 150 to control an amount of air supplied to the server room through the first supply unit 150. An example of such a first supply damper 151 includes an MD that is automatically opened or closed by an electric motor or air pressure. Such a first supply damper 151 may immediately supply outer air into the server room during an emergency, such as system malfunction, to prevent a temperature increase in the server room.

The second supply unit 160 may be provided at one side of the first supply unit 150 to supply outer air that has passed through the mist ejection unit 130 or the cooling unit 140 to the server room, particularly, to the top of the server room. Such a second supply unit 160 may be provided above the first supply unit 150. Such a second supply unit 160 may include a blast fan 161 and a second supply damper 163.

The blast fan 161 sucks outer air flowed in through the outer air inflow unit 110 in towards the second supply unit 160. In other words, by providing the blast fan 161 above a natural air path moving along the filter unit 120, the mist ejection unit 130, the cooling unit 140, and the first supply unit 150, which are provided linearly, reverse rotation of the blast fan 161 may be prevented, and a delay time is not required during a switching operation from the first supply unit 150 to the second supply unit 160.

As described below, an air conditioning system 1 of a data center, according to an embodiment may include a plurality of the blast fans 161, and each of the blast fans 161 may be individually adjusted such that overall air volume is uniformly maintained even when some of the blast fans 161 malfunction by increasing air volume of the remaining of the blast fans 161.

Meanwhile, the second supply damper 163 controls opening and closing of the second supply unit 160 to control the amount of air supplied to the server room through the second supply unit 160. An example of such a second supply damper 163 includes an MD that is automatically opened or closed by an electric motor or air pressure.

As such, by using the first supply unit 150 provided below the server room cooling apparatus 100 and the second supply unit 160 provided above the server room cooling apparatus 100 together, a supply structure of outer air may vary according to a structure of a server rack (see 210 of FIG. 7). Moreover, by using the first supply unit 150 provided below the server room cooling apparatus 100, the bottom space of the server rack (see 210 of FIG. 7), which is generally used as a cold air supply pipe, may be used as a part of the server rack (see 210 of FIG. 7), and thus a space of a server room 200 may be additionally obtained.

In other words, in a conventional air conditioning system of a data center, a space for supplying cold air needs to be provided below a server room in order to supply cold air to the server room. Thus, a certain space is left below the server room and a bottom surface for disposing a server thereon needs to be formed, and accordingly, the structure of the server room needs to be changed while changing a cooling method. Also, since a space in the server room is reduced as much as the space formed below the server room, space use is decreased.

In contrast, in the server room cooling apparatus according to an embodiment of the present invention, and the air conditioning system of a data center, the air conditioning system including the server room cooling apparatus, by using the first supply unit 150 provided below the server room cooling apparatus 100 and the second supply unit 160 provided above the sever room cooling device 100 together, a separate space for supplying cold air below the server room is not required, and thus space use inside the data center is largely increased. Moreover, since a structure of the server room is not required to be changed in order to connect the server room and the server room cooling apparatus, an existing structure of the data center is not changed and may be intactly used.

Meanwhile, although not illustrated in drawings, the server room cooling apparatus 100 may further include a measurer (not shown) for measuring the temperature and humidity of outer air led in from the outer air inflow unit 110. For example, the measurer may include a temperature sensor for measuring the temperature and a humidity sensor for measuring humidity. Information about the temperature and the humidity of the outer air measured by the measurer may be transmitted to a controller (not shown).

The controller (not shown) adjusts an ejection amount of mist ejected from the mist ejection unit 130 such that outer air led in through the outer air inflow unit 110 maintains optimal temperature/humidity based on the information about the temperature and the humidity of the outer air received from the measurer (not shown), thereby cooling or moisturizing the flowed outer air.

For example, the controller (not shown) may reduce the temperature of the outer air by adjusting the ejection amount of the mist when it is determined that the inside of the server room needs to be cooled by comparing information about temperature/humidity inside the server room and the information about the temperature/humidity of the outer air. On the other hand, when it is determined that the temperature inside the server room is appropriate but the server room needs to be humidified, the controller may adjust the ejection amount of the mist to increase the humidity of the outer air supplied into the server room.

FIG. 7 is a perspective view of an air conditioning system of a data center, according to an embodiment, and FIG. 8 is a plan view of the air conditioning system of the data center of FIG. 7. FIG. 9 is a lateral view of a cool zone of the air conditioning system of the data center of FIG. 7, and FIG. 10 is a lateral view of a hot zone of the air conditioning system of the data center of FIG. 7.

Here, cold air (supply air SA) of FIG. 9 shows air flow in a cool zone CZ, and hot air (return air RA) of FIG. 10 shows air flow in a hot zone HZ.

Referring to FIGS. 7 through 10, the air conditioning system 1 of the data center, the air conditioning system 1 including the server room cooling apparatus 100, includes the server room 200, a plurality of server racks 210 arranged along a first direction (A direction) in the server room 200, and at least one server room cooling apparatus 100 provided at one side of the server room 200, into which outer air flows, and supplying the outer air to the server room 200.

Here, a plurality of servers may be provided in each of the server racks 210, wherein spaces between the server racks 210 may be alternately the hot zone HZ and the cool zone CZ. Here, the cool zone CZ may receive cold air from the server room cooling apparatus 100 by being connected to the server room cooling apparatus 100. Cold air supplied to the cool zone CZ flows to the server rack 210, is heated by the plurality of servers included in the server rack 210 while passing through the plurality of servers, and then is externally discharged through the hot zone HZ and a discharging unit 220 connected to the hot zone HZ or is supplied back to the server room cooling apparatus 100. Accordingly, the cool zone CZ is connected to the server room cooling apparatus 100 and is opened, and the hot zone HZ is blocked with respect to the server room cooling apparatus 100. Here, in FIG. 7, the hot zone HZ and the cool zone CZ are illustrated as if they communicate with each other for convenience of illustration, and the hot zone HZ and the cool zone CZ may communicate with each other, but for efficient cooling of a server, the hot zone HZ and the cool zone CZ may be blocked from each other, the cool zone CZ may be connected to the server room cooling apparatus 100 to receive cold air (supply air SA) from the server room cooling apparatus 100, and the hot zone HZ may be blocked with respect to the server room cooling apparatus 100 such that hot air (return air RA) is discharged through the discharging unit 220 provided above the server room 200.

In detail, cold air (supply air SA) supplied to the cool zone CZ of the server room 200 is supplied to each of a series of the server racks 210, and hot air (return air RA) discharged from the server rack 210 flows to the discharging unit 220 provided above the server room 200 through the hot zone HZ. Air flowed to the discharging unit 220 may be flowed again to the server room cooling apparatus 100 or discharged outside the server room 200 as occasion demands.

Here, the discharging unit 220 is provided above the server room 200 to discharge air inside the server room 200. An example of the discharging unit 220 includes a duct, and when cold air supplied from the server room cooling apparatus 100 is heated through the server rack 210 included in the server room 200 and then lifted above the server room 200, the discharging unit 220 may suck the heated air and discharge the heated air outside the server room 200.

The discharging unit 220 of such a server room 200 may be connected to the return duct unit 170 of the server room cooling apparatus 100. Accordingly, hot air discharged from the server room 200 according to control of the controller flows to the server room cooling apparatus 100 through the discharging unit 220 and the return duct unit 170, and thus outer air and air inside the server room 200 may be mixed. At this time, the mist ejection unit 130 may spray mist into the mixed air such that the server room 200 is efficiently cooled or humidified.

Meanwhile, a plurality of the server room cooling apparatuses 100 may be provided along the first direction (A direction of FIG. 7). Also, the plurality of server room cooling apparatuses 100 may be opened such that air flows therebetween. In other words, side walls of the adjacent server room cooling apparatuses 100 may be opened such that air flows between the server room cooling apparatuses 100. Accordingly, the air conditioning system 1 including the plurality of server room cooling apparatuses 100 may be integrally operated. In other words, as described above, a plurality of the blast fans 161 may be provided such that air volume of the blast fans 161 is individually adjusted, and thus overall air volume may be uniformly maintained even when some of the blast fans 161 malfunction, by increasing air volume of the remaining of the blast fans 161.

As such, by using the plurality of server room cooling apparatuses 100 that communicate with each other, it is possible to use an entire space outside the server room 200 as one cooling apparatus, and thus conveyance power may be reduced by reducing air resistance, a surrounding environment is not complex since a duct is not provided in the cooling apparatus, and a maintenance space may be secured. Moreover, noise and vibration in equipment may be reduced as an air current is stabilized, a service life of the equipment may be increased, and a static pressure loss may be reduced according to a stabilized air flow. Also, the air conditioning system 1 according to an embodiment has a mixed structure of a built up structure and a package structure, and thus has both excellent space use that is an advantage of the built up structure and excellent air-tightness and excellent insulation, which are advantages of the package structure.

Hereinafter, a method of operating such an air conditioning system 1 of the data center will be described in detail.

Outer air outside the data center is led into the server room cooling apparatus 100 through the outer air inflow unit 110 of the server room cooling apparatus 100. Here, foreign substances included in the outer air may be blocked through the outer air inflow unit 110 and the filter unit 120. The outer air from which the foreign substances are blocked may pass through the mist ejection unit 130 of the server room cooling apparatus 100 to be cooled or humidified by mist sprayed from the mist ejection unit 130. Then, the cooled or humidified outer air is supplied to the server room 200 through the first supply unit 150 and/or the second supply unit 160 provided at one side of the server room cooling apparatus 100. Here, when the temperature of the outer air is equal to or higher than a pre-set value, the server room cooling apparatus 100 may activate the cooling member 141 included in the cooling unit 140 of the server room cooling apparatus 100 such that cold air is supplied into the server room 200.

Then, the cold air supplied to the cool zone CZ of the server room 200 is led to the server rack 210 included in the server room 200, is heated by the plurality of servers included in the server rack 210, is discharged to the hot zone HZ, and then is discharged outside the server room through the discharging unit 220 provided above the hot zone HZ. At this time, some of the air discharged to the discharging unit 220 may be supplied again to the outer air inflow unit 110 through the return duct unit 170 of the server room cooling apparatus 100 as occasion demands.

According to the disclosure, by reducing the number of pieces of equipment included in the air conditioning system of the data center, space may be efficiently used. Also, by reducing an interval between the mist ejection unit 130 and the cooling unit 140, a cooling efficiency by ejecting mist may be increased. Also, power for flowing outer air may be reduced by reducing a curve of an outer air path to obtain a natural air current space. Moreover, since cooling is possible by using only secondary exhaust power without having to use primary electric power, energy consumption may be reduced as an amount of outer air supplied into the server room is increased.

Mode Of The Invention

Hereinafter, methods of manufacturing the server room cooling apparatus 100 and the air conditioning system 1 of a data center, the air conditioning system 1 including the server room cooling apparatus 100, will be described in detail.

FIGS. 11 through 22 are views for describing a method of manufacturing the server room cooling apparatus 100, according to an embodiment of the present disclosure.

Referring to above drawings and FIGS. 11 through 22, the method of manufacturing the server room cooling apparatus 100, according to an embodiment of the present disclosure, includes providing a housing, providing a cooling water supply pipe in the housing, providing a bottom portion at a base surface of the housing, providing an inner wall along an outer wall of the housing, providing a frame in the housing, providing a barrier wall on the frame, providing a blast fan to a second supply unit formed by the barrier wall, providing a cooling unit along the frame, providing a mist ejection unit and a filter unit at one side of the cooling unit, providing a grating unit at one side of the filter unit, providing an outer air inflow unit at one side of the grating unit, and providing a return duct unit to communicate with the outer air inflow unit.

The method will now be described in detail.

First, referring to FIG. 11, a housing 11 is provided on the ground. The housing 11 forms an overall external shape of the server room cooling apparatus 100, and the outer air inflow unit 110, the filter unit 120, the mist ejection unit 130, the cooling unit 140, the first supply unit 150, and the second supply unit 160 shown in FIG. 1 are arranged in the housing 11.

The housing 11 includes a base portion 13 forming a bottom surface, a top plate portion 19 forming a top surface, and first and second outer walls 15 and 17 formed between and supporting the base portion 13 and the top plate portion 19. Here, the first and second outer walls 15 and 17 may each be partially opened and respectively communicate with the outside of the server room cooling apparatus 100 and the server room 200. Also, the housing 11 may be provided on the ground after an overall internal and external sealing operation is performed on the housing 11 to prevent an air leakage.

Meanwhile, as described above, a plurality of the server room cooling apparatus 100 may be provided along a first direction (a direction indicated by an arrow A of FIG. 7), and in this case, the housings 11 of the adjacent server room cooling apparatus 100 may be formed to be connected and combined to each other. In this regard, side portions of the adjacent housing 11 may have shapes to be engaged with each other as will be described in detail below with reference to FIGS. 23 and 24.

Then, referring to FIG. 12, a cooling water supply pipe 21 is provided in the housing 11. The cooling water supply pipe 21 may be formed along a direction perpendicular to the ground, and may supply predetermined cooling water to a cooling unit (see 140 of FIG. 1).

Then, referring to FIG. 13, a bottom portion 23 is provided at the base portion 13 of the housing 11. Here, the bottom portion 23 may include a drain unit (see 133 of FIG. 1) of a mist ejection unit (see 130 of FIG. 1), and the drain unit 133 may be formed below the mist ejection unit 130 to smoothly and externally discharge water condensed and collected at the bottom of the mist ejection unit 130. Other various components related to arrangement of a component or drainage may be included at the bottom portion 23.

Then, referring to FIG. 14, first and second inner walls 25 and 27 are provided along the first and second outer walls 15 and 17 of the housing 11. Here, the first and second inner walls 25 and 27 may be partially opened correspondingly to the first and second outer walls 15 and 17 to each communicate with the outside of the server room cooling apparatus 100 and the server room 200.

Then, referring to FIG. 15, a frame 31 is provided inside the housing 11. Here, the frame 31 has a beam or pillar shape, and defines each of the components, i.e., the outer air inflow unit 110, the filter unit 120, the mist ejection unit 130, the cooling unit 140, the first supply unit 150, and the second supply unit 160 shown in FIG. 1.

Then, referring to FIG. 16, a barrier wall 33 is provided on the frame 31. The barrier wall 33 includes at least one plate to divide a space in the housing 11, and defines a flow path of outer air introduced from outside the server room cooling apparatus 100. In other words, the barrier wall 33 separates a path outer air moves to a server room (see 200 of FIG. 7), i.e., the outer air inflow unit 110, the filter unit 120, the mist ejection unit 130, the cooling unit 140, the first supply unit 150, and the second supply unit 160, from other spaces.

Then, referring to FIG. 17, the blast fan 161 is provided in the second supply unit 160 formed by the barrier wall 33. Here, the blast fan 161 sucks outer air introduced through the outer air inflow unit 110 towards the second supply unit 160. In other words, by providing the blast fan 161 above a natural air path moving along the filter unit 120, the mist ejection unit 130, the cooling unit 140, and the first supply unit 150, which are arranged in a straight line, reverse rotation of the blast fan 161 may be prevented, and a delay time is not required during a switching operation from the first supply unit 150 to the second supply unit 160.

Then, referring to FIG. 18, the cooling unit 140 is provided along the frame 31, at one side of the first and second supply units 150 and 160. Here, the cooling unit 140 is provided between the first supply unit 150 described above and the mist ejection unit 130 that is to be provided next to further cool outer air that has passed through the mist ejection unit 130. The cooling unit 140 may include the cooling member 141 having a cooling coil shape, and here, the cooling member 141 may be an oval coil. Although not illustrated, the cooling unit 140 may be connected to the cooling water supply pipe 21 through the bottom portion 23 to receive cooling water required for cooling.

Then, referring to FIG. 19, the mist ejection unit 130 and the filter unit 120 are formed at one side of the cooling unit 140. First, the ejection nozzle 131 of the mist ejection unit 130 is provided at one side of the cooling unit 140. In detail, the ejection nozzle 131 of the mist ejection unit 130 ejects minute water particles, i.e., mist, into outer air that is fed in through the outer air inflow unit 110 such that the temperature and humidity inside the server room are maintained at a suitable level. In other words, by ejecting mist into the outer air, the mist ejection unit 130 increases low humidity that is a characteristic of outer air, and decreases the temperature of the outer air, thereby supplying air suitable for operating equipment into the server room. Such a mist ejection unit 130 may eject mist by increasing pressure of water by using a pump and directly ejecting the mist into outer air passing through the mist ejection unit 130 through the ejection nozzle 131.

Meanwhile, the roll filter 121 of the filter unit 120 is provided at one side of the mist ejection unit 130. The roll filter 121 may re-filter foreign substances included in outer air, and may have a rolled shape and be automatically replaced according to a contamination level of the roll filter 121. Thus, the roll filter 121 may be used for a long period of time after being installed once, and since replacement of a filtering member is simple, a replacement time of the roll filter 121 may be reduced.

Then, referring to FIG. 20, the grating unit 115 is provided at one side (top) of the filter unit 120. The grating unit 115 may separate the filter unit 120 from the outer air inflow unit 110, and outer air flowed in to the outer air inflow unit 110 may pass through the grating unit 115 and move to the filter unit 120.

Then, referring to FIG. 21, the OA damper 111, the demister filter 113, and the RA damper 117 of the outer air inflow unit 110 are provided at one side of the grating unit 115. Next, the return duct unit 170 is provided at one side of the outer air inflow unit 110, and at this time, the outer air inflow unit 110 and the return duct unit 170 may communicate with each other through the RA damper 117.

Here, the OA damper 111 controls opening and closing of the outer air inflow unit 110, and controls an amount of outer air flowed in through the outer air inflow unit 110. Also, the demister filter 113 is an apparatus that removes moisture or foreign substances in vapor, and is manufactured by stacking a plurality of meshes or by charging an object in a fiber state.

Meanwhile, the return duct unit 170 to which return air that has passed through the server room (see 200 of FIG. 7) is supplied may be formed at one side of the outer air inflow unit 110, and the RA damper 117 for controlling air flow between the outer air inflow unit 110 and the return duct unit 170 may be further provided between the outer air inflow unit 110 and the return duct unit 170. The RA damper 117 adjusts a mixing ratio of outer air and return air to control the temperature of air supplied into the server room cooling apparatus 100 to be maintained at a suitable level.

FIG. 23 is a perspective view of any one side surface of a housing, and FIG. 24 is a perspective view of another side surface of the housing, which is formed to engage with the one side surface.

Referring to FIGS. 23 and 24, one side surface and another side surface of the housing 11 may have shapes that engage with each other. For example, when a protrusion 13*aa* is formed at a center portion of one side surface 13*a* of the housing 11 and grooves are formed at two sides of the protrusion 13*aa*, a groove 13*bb* having a shape engaging with the protrusion 13*aa* may be formed at a center portion of another side surface 13*b* of the housing 11 and protrusions may be formed at two sides of the groove 13*bb*. In other words, in a conventional server room cooling apparatus, two side surfaces of a housing are formed in flat shapes and thus the housings are combined by using a binder or the like. However, in this case, binding force between adjacent housings is weak, and the combined housings may be detached from each other. In this regard, one side surface and another side surface of the housing 11 of the server room cooling apparatus 100 according to an embodiment of the present disclosure are formed in shapes to engage with each other, and accordingly, binding force between adjacent housings is reinforced and durability of the server room cooling apparatus 100 is reinforced.

The server room cooling apparatus 100 manufactured as such is shown in FIG. 22. According to the method of manufacturing the server room cooling apparatus 100, according to an embodiment of the present disclosure, by packaging each component according to a predetermined optimized order and manufacturing a server room cooling apparatus, manufacturing processes of the server room cooling apparatus are simplified, a manufacturing time is reduced, and a manufacturing yield is increased. Also, when the air conditioning system 1 of a data center is configured by combining a plurality of the server room cooling apparatus 100 manufactured as above, it is easy to combine the plurality of server room cooling apparatus 100 and overall durability of the air conditioning system 1 of the data center is reinforced.

Also, the server room cooling apparatus 100 manufactured as such and the air conditioning system 1 of the data center, the air conditioning system 1 including the server room cooling apparatus 100, may be operated year-round, without stopping even under environment conditions in which temperature/humidity states change a lot, by spraying mist into outer air fed in from outside a building to supply cold air into a server room, thereby remarkably reducing the amount of energy consumed to cool the data center. Also, the server room cooling apparatus 100 manufactured as such and the air conditioning system 1 of the data center, the air conditioning system 1 including the server room cooling apparatus 100, may prevent a temperature increase inside a server room by immediately supplying outer air into the server room during an emergency, such as system malfunction, and in addition, space use inside the data center may be increased.

While one or more embodiments have been described with reference to the figures, it will be understood by those of ordinary skill in the art that various changes in form and details may be made therein without departing from the spirit and scope of the inventive concept as defined by the following claims.

INDUSTRIAL APPLICABILITY

Embodiments of the disclosure may be used in a method of manufacturing a server room cooling device for cooling a server room by using external natural air, and a method of manufacturing an air-conditioning system of a data center, the air-conditioning system including the server room cooling device.

The invention claimed is:

1. A method of manufacturing a server room cooling apparatus for cooling a server room storing a plurality of servers, the method comprising:
providing a housing configured to be operatively connected to an outside of the server room;
providing at least one frame in the housing;
providing, on the at least one frame, a barrier wall configured to divide a space inside the housing into a first space and a second space, the first space defining a first flow path for outer air from outside the server room to flow through the first space in a first direction into the server room, and the second space being configured to enable air discharged from the server room to flow through the second space in a second direction opposite the first direction into the first flow path;

forming a mist ejection unit configured to eject mist to the outer air supplied from outside the server room, at a side of a supply unit that is formed by the barrier wall and supplies the outer air to the server room;

forming a filter unit configured to the filter outer air supplied from outside the server room, at a side of the mist ejection unit; and forming an outer air inflow unit into which outer air from outside the server room enters the first flow path, at one side of the filter unit, wherein the filter unit, the mist ejection unit and the supply unit are arranged in the first space of the housing in a linear direction relative to each other, so that the outer air flows in the linear direction through the filter unit, the mist ejection unit and the supply unit.

2. The method of claim 1, further comprising, after the providing of the housing, forming a bottom portion comprising a drain unit configured to externally discharge water condensed in the mist ejection unit, on a base surface of the housing.

3. The method of claim 1, wherein the supply unit comprises:
a first supply unit provided at one side of the mist ejection unit and configured to supply outer air that has passed through the mist ejection unit to the server room; and
a second supply unit configured to supply at least some of outer air that has passed through the mist ejection unit to the server room.

4. The method of claim 3, further comprising, after the providing of the barrier wall, providing a blast fan to the second supply unit.

5. The method of claim 3, wherein the second supply unit is formed in a direction perpendicular to an outer air inflow direction of the outer air inflow unit, with respect to the first supply unit.

6. The method of claim 1, further comprising, after the providing of the barrier wall, forming a cooling unit configured to cool outer air that has passed through the mist ejection unit, between the supply unit and the mist ejection unit.

7. The method of claim 6, further comprising, after the providing of the housing, providing a cooling water supply pipe in the housing, wherein cooling water is supplied to the cooling unit through the cooling water supply pipe.

8. The method of claim 1, further comprising, after the forming of the outer air inflow unit, forming a return duct unit configured to communicate with the outer air inflow unit.

9. The method of claim 1, wherein the filter unit is formed in a direction perpendicular to an outer air inflow direction of the outer air inflow unit, with respect to the outer air inflow unit.

10. A method of manufacturing an air conditioning system of a data center, the method comprising:
manufacturing the server room cooling apparatus according to the method of claim 1; and
forming the server room comprising a plurality of server racks provided along a first direction, at one side of the server room cooling apparatus.

11. The method of claim 10, wherein the manufacturing of the server room cooling apparatus comprises forming and combining a plurality of the server room cooling apparatuses along the first direction.

12. The method of claim 11, wherein faces of two adjacent server room cooling apparatuses, which contact each other, have mutual engaging shapes.

13. The method of claim 11, wherein a groove is formed in one side surface of one of two adjacent server room cooling apparatuses, and a protrusion having a shape engaging with the groove is formed in one side surface of the other one of the two adjacent server room cooling apparatuses.

14. The method of claim 11, wherein the plurality of server room cooling apparatuses are opened such that air flows therebetween.

15. The method of claim 10, wherein the server room is formed such that at least one cool zone and at least one hot zone are alternately arranged, wherein the at least one cool zone is formed in a space between adjacent server racks and receives the outer air from the server room cooling apparatus and the at least one hot zone is formed in a space between adjacent server racks and discharges the outer air received by the at least one cool zone after the outer air passes through servers included in the plurality of server racks.

16. The method of claim 10, wherein the forming of the server room comprises forming a discharging unit configured to externally discharge the outer air received from the server room cooling apparatus.

17. The method of claim 16, wherein one side of the discharging unit is connected to a return duct unit of the server room cooling apparatus, and
at least some of the outer air received from the server room cooling apparatus is supplied back to the server room cooling apparatus through the return duct unit.

18. The method of claim 1, wherein the air discharged from the server room passes through the servers in the server room before being discharged from the server room.

19. A method of manufacturing a server room cooling apparatus for cooling a server room, the method comprising:
providing a housing;
providing at least one frame in the housing;
providing, on the at least one frame, a barrier wall configured to divide a space inside the housing into at least two spaces and define a flow path for outer air from outside the server room to flow to inside the server room;
forming a mist ejection unit configured to eject mist to the outer air supplied from outside the server room, at a side of a supply unit that is formed by the barrier wall and supplies the outer air to the server room;
forming a filter unit configured to the filter outer air supplied from outside the server room, at a side of the mist ejection unit; and
forming an outer air inflow unit into which outer air from outside the server room enters the flow path, at one side of the filter unit;
wherein the supply unit comprises:
a first supply unit supplying the outer air to a lower portion of the server room; and
a second supply unit provided at one side of the first supply unit and supplying at least a part of the outer air to an upper portion of the server room,
wherein the second supply unit is provided in a direction perpendicular to an outer air inflow direction of the outer air inflow unit, with respect to the first supply unit, such that the outer air is supplied from the first supply unit to the second supply unit in a direction perpendicular to the outer air inflow direction of the outer air inflow unit,
wherein the server room is cooled by the outer air that is supplied from the first supply unit to the upper portion of the server room via the second supply unit.

* * * * *